(12) United States Patent
Yamada

(10) Patent No.: US 6,889,299 B1
(45) Date of Patent: May 3, 2005

(54) SEMICONDUCTOR INTEGRATED CIRCUIT

(75) Inventor: Yoichi Yamada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/720,142

(22) PCT Filed: Apr. 27, 2000

(86) PCT No.: PCT/JP00/02768

§ 371 (c)(1),
(2), (4) Date: Dec. 21, 2000

(87) PCT Pub. No.: WO00/65598

PCT Pub. Date: Nov. 2, 2000

(30) Foreign Application Priority Data

Apr. 27, 1999 (JP) ............................................ 11-119648
Jun. 22, 1999 (JP) ............................................ 11-175533

(51) Int. Cl.[7] ................................................ G06F 12/00
(52) U.S. Cl. ..................... 711/167; 711/103; 711/170
(58) Field of Search ................................. 711/104, 154, 711/603, 170, 137, 172; 305/52; 713/1

(56) References Cited

U.S. PATENT DOCUMENTS

| | | | | |
|---|---|---|---|---|
| 4,485,437 A | * | 11/1984 | Kinghorn ...................... 714/53 |
| 5,079,725 A | | 1/1992 | Geer et al. .................... 714/720 |
| 5,319,598 A | * | 6/1994 | Aralis et al. ............ 365/189.12 |
| 5,642,307 A | | 6/1997 | Jernigan ....................... 365/103 |
| 5,794,066 A | | 8/1998 | Dreyer et al. .................. 712/32 |
| 5,860,134 A | * | 1/1999 | Cowell ........................ 711/172 |
| 6,085,284 A | * | 7/2000 | Farmwald et al. ........... 711/105 |
| 6,178,483 B1 | * | 1/2001 | Runaldue et al. ............ 711/137 |
| 6,181,629 B1 | * | 1/2001 | Ogura ......................... 365/227 |
| 6,381,671 B1 | * | 4/2002 | Ayukawa et al. ............ 711/104 |

FOREIGN PATENT DOCUMENTS

| | | |
|---|---|---|
| EP | 0 831 401 | 3/1998 |
| JP | A-55-72248 | 5/1980 |
| JP | A-60-171540 | 9/1985 |
| JP | A-60-246085 | 12/1985 |
| JP | A-4-119440 | 4/1992 |

OTHER PUBLICATIONS

Handy, "The Cache Memory Book", © 1998 Academic Press, Inc. p. 89–90.*

* cited by examiner

*Primary Examiner*—Donald Sparks
*Assistant Examiner*—Brian R. Peugh
(74) *Attorney, Agent, or Firm*—Oliff & Berridge PLC

(57) ABSTRACT

A semiconductor integrated circuit connected to an external processor has a memory which stores data, a terminal which connects the memory with the processor, an information generation circuit which generates production information about the semiconductor integrated circuit, and a write circuit which writes the information into the memory after the semiconductor integrated circuit is reset or a command from the processor ends.

17 Claims, 13 Drawing Sheets

SEMICONDUCTOR INTEGRATED CIRCUIT

TECHNICAL FIELD

The present invention relates to a semiconductor integrated circuit. More particularly, the present invention relates to a semiconductor integrated circuit having an identification number (ID) relating to a production history and a manufacturer's number of an IC chip.

BACKGROUND OF ART

In some conventional semiconductor integrated circuits (ICs), an ID showing a production history, manufacturer's number, or the like of an IC chip is stored in an ID reference register provided in the IC chip. The ID is read by an external CPU and used for various purposes.

FIG. 13 shows an example of a connection between such a conventional semiconductor IC and an external circuit. In FIG. 13, an internal circuit 100 of a semiconductor integrated circuit has an ID generation circuit 101 which generates an ID, an ID reference register 102 for storing the ID, and a built-in memory 103. The built-in memory 103 is connected to an external CPU 200 through a terminal 104 and is used as a cache memory or the like for the CPU 200. The ID showing a production history, manufacturer's number, or the like of the IC chip is generated in the ID generation circuit 101 and stored in the ID reference register 102. The ID is read by the external CPU 200 through the terminal 105. Firmware 201, which is one type of software, recognizes the ID and specifies the production history, manufacturer's number, and the like of the IC chip, thereby appropriately controlling each IC.

However, about one hundred are required in the case of an 8-bit address to provide the ID reference register 102, thereby increasing the circuit scale.

The circuit scale may be decreased by storing the ID in a work area (area for storing general data) of the built-in memory 103 when resetting the IC. This may cause a problem in which general data may be overwritten in the same address of the memory in which the ID has been written, thereby making it impossible to refer to the ID.

It is possible to prevent the ID from being overwritten by general data by providing a write-only area for the ID outside the work area. However, this decreases the work area.

Accordingly, an object of the present invention is to provide a semiconductor integrated circuit capable of referring to the ID while reducing the circuit scale in the IC required for storing the ID without decreasing the work area of the memory.

DISCLOSURE OF INVENTION

A semiconductor integrated circuit connected to an external processor according to one aspect of the present invention comprises:

a memory which stores data;

a terminal which connects the memory with the processor;

an information generation circuit which generates production information about the semiconductor integrated circuit; and a write circuit which writes the information into the memory before the semiconductor integrated circuit starts normal operation.

A semiconductor integrated circuit connected to a combination of an external memory and a processor according to another aspect of the present invention comprises:

a terminal connected to the external memory;

an information generation circuit which generates production information about the semiconductor integrated circuit; and a write circuit which writes the information into the external memory through the terminal before the semiconductor integrated circuit starts normal operation.

A semiconductor integrated circuit having a built-in processor according to still another aspect of the present invention comprises:

a memory which is connected to the processor and stores data;

an information generation circuit which generates production information about the semiconductor integrated circuit; and a write circuit which writes the information into the external memory through the terminal before the semiconductor integrated circuit starts normal operation.

In the semiconductor integrated circuits according to the above aspects of the present invention, the production information (ID) of the semiconductor integrated circuit is written in the built-in memory or the external memory before the semiconductor integrated circuit starts normal operation. By this configuration, the ID stored in the memory can be read by the processor immediately after the semiconductor integrated circuit has started normal operation, whereby the processor can appropriately control the semiconductor integrated circuit. Once the processor refers to the ID, general data may be overwritten in the area where the ID is stored, thereby ensuring versatility of the built-in memory or external memory. Therefore, the memory which stores the ID may be used as a cache memory accessed by the processor.

Since the number of gates in the write circuit and the like can be remarkably reduced in comparison with conventional registers and a general-purpose memory can be used for storing the ID, the circuit scale of the semiconductor integrated circuit can be decreased.

The timing before the semiconductor integrated circuit starts normal operation may be the timing after the semiconductor integrated circuit is reset, for example. This timing may be the timing when a rest (power-on reset, for example) is released. Specifically, the ID of the semiconductor integrated circuit maybe written into the memory in a transition period which is a period after the non-operational period is ended by turning on the semiconductor integrated circuit but before the semiconductor integrated circuit starts normal operation, for example.

As another example of the timing before the semiconductor integrated circuit starts normal operation, the timing when a command from the processor ends may be given. The semiconductor integrated circuit operates according to commands from the processor and can accept the next normal operation when the command ends. Therefore, the ID of the semiconductor integrated circuit may be written into the memory before the semiconductor integrated circuit starts the next normal operation in response to the end of the command from the processor. In particular, writing the ID into the memory after both the reset and the end of the command ensures that the ID can be referred even if the general data is overwritten onto the ID, without providing a write-only area for the ID.

As still another example of the timing before the semiconductor integrated circuit starts normal operation, the timing when releasing the sleep state may be given. The operation of the semiconductor integrated circuit is suspended during the sleep state. The ID may be written into the memory before the semiconductor integrated circuit starts normal operation by releasing the sleep state. The ID may be written in the memory in response to a chip-enable signal that selects the semiconductor integrated circuit.

The production information of the semiconductor integrated circuit may be an identification number showing a production history or a manufacturer's number of the IC chip, and the like. In particular, in the case of semiconductor integrated circuits compatibly used among several manufacturers, incompatible parts and the like can be recognized using the ID, whereby the processor can appropriately control each semiconductor integrated circuit corresponding to the ID.

BEST MODE FOR CARRYING OUT THE INVENTION

Embodiments of the present invention will be described with reference to drawings.

First Embodiment

Figure 1:
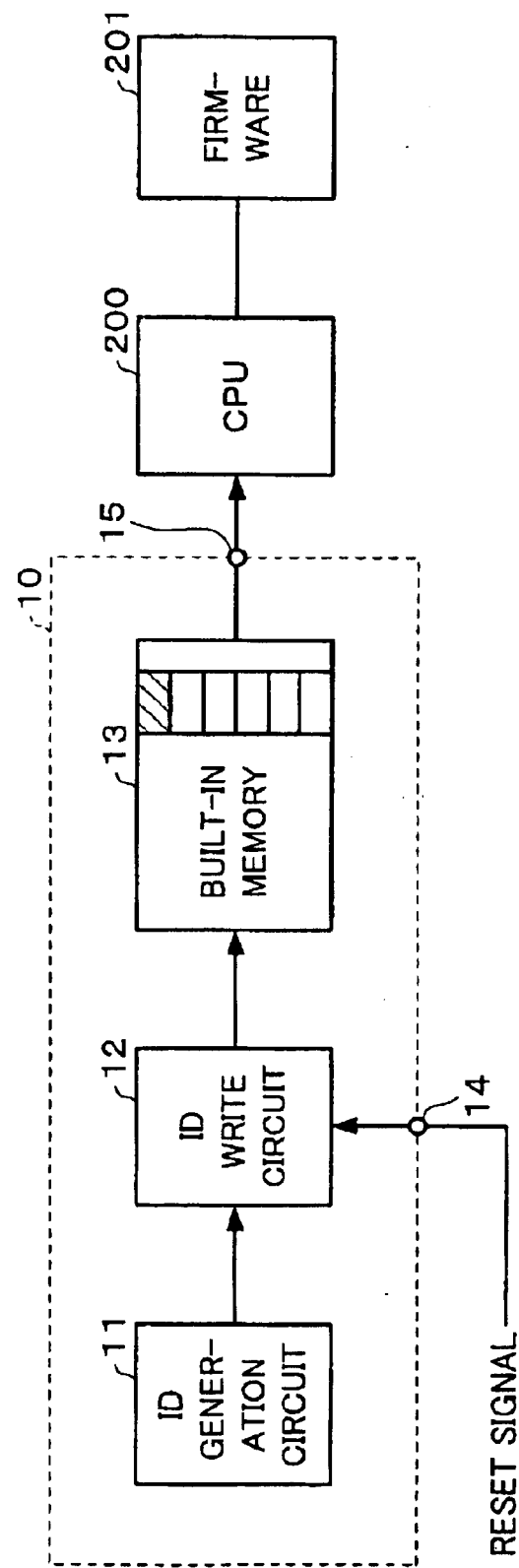
FIG. 1 shows a connection between a semiconductor integrated circuit according to a first embodiment of the present invention and an external circuit.

FIG. 1 shows a connection between a semiconductor integrated circuit according to a first embodiment of the present invention and an external circuit. The present embodiment is applied to a device in which a semiconductor integrated circuit (IC) having a built-in memory is connected to an external circuit including a CPU.

In FIG. 1, an internal circuit 10 of an IC includes at least an ID generation circuit 11 which generates an ID, an ID write circuit 12 for writing the ID in response to a reset signal input through an internal terminal or external terminal 14, and a built-in memory 13 used as a cache memory or the like.

The ID shows information such as a production history (product version, for example) or a manufacturer's number of an IC chip. The ID generation circuit 11 generates the ID formed of combination of signals showing logical "1" and "0" when the power is supplied. The ID is stored in an address of the built-in memory 13 by the ID write circuit 12. In the present embodiment, the address in which the ID is stored is previously designated by firmware 201.

The built-in memory 13 is connected to an external CPU 200 through an external terminal 15. The ID stored in the built-in memory 13 is read by the external CPU 200. The firmware 201, which is one type of software, recognizes the ID and specifies the production history, manufacturer's number, and the like of the IC chip, thereby appropriately controlling the IC. The ID write circuit 12 can be formed by twenty to thirty gates.

Figure 13:
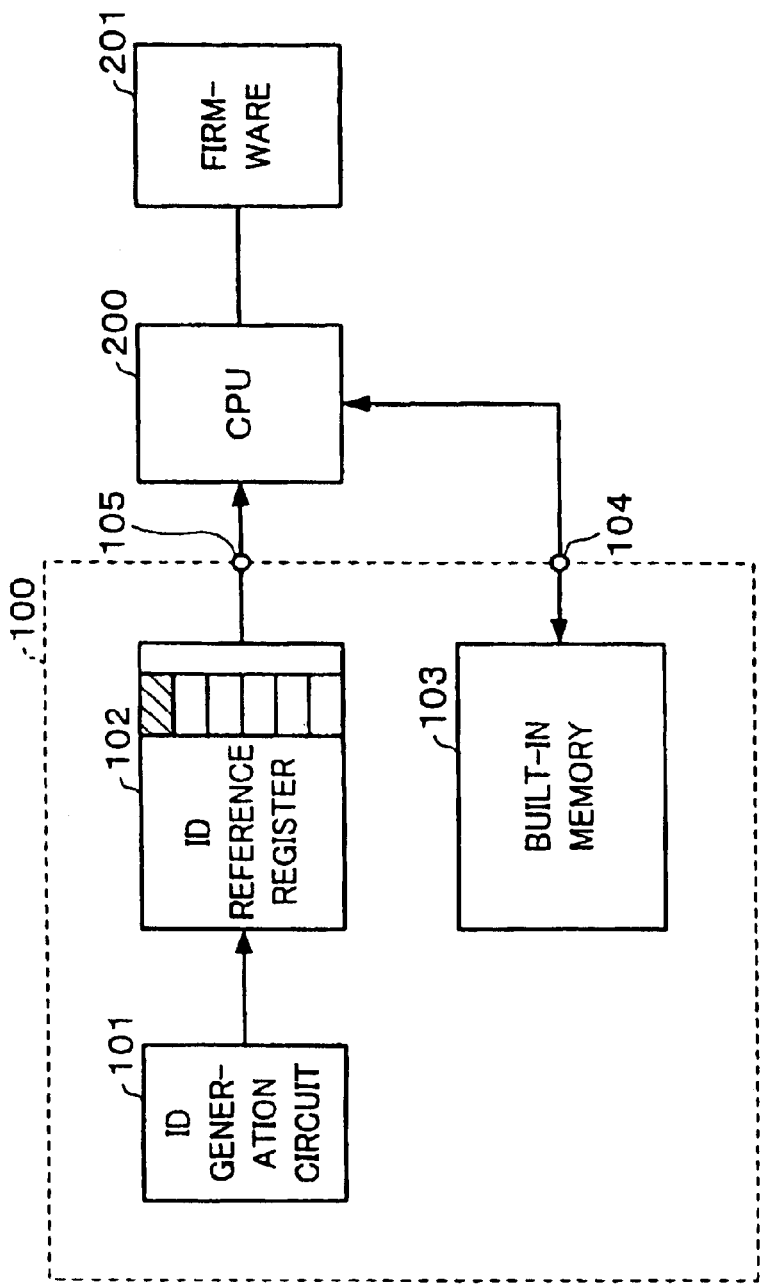
FIG. 13 shows a connection between a conventional semiconductor integrated circuit and an external circuit.

Therefore, the number of gates required for storing the ID can be decreased from one hundred gates to twenty to thirty gates by using the ID write circuit 12 and the built-in memory 13 instead of a conventional ID reference register 102 (see FIG. 13). Because of this, the circuit scale of the IC having the internal circuit 10 can be reduced.

The reason why the CPU 200 reads the ID from the built-in memory 13 instead of directly reading from the ID generation circuit 11 is to transfer the ID through a CPU bus while synchronizing the ID with the clock.

Figure 2:
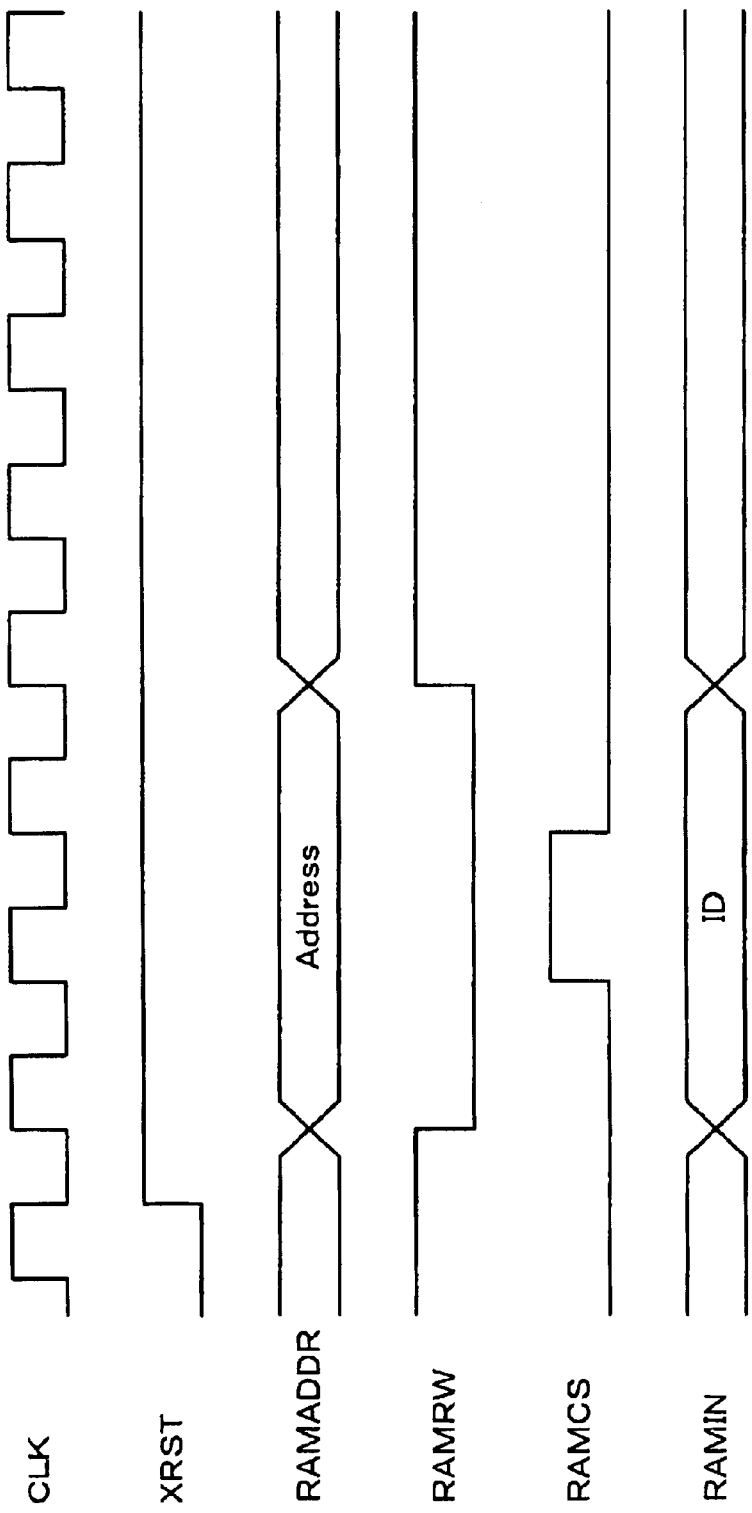
FIG. 2 is a timing chart showing signals used in a first embodiment of the present invention.

The operation of the semiconductor integrated circuit having the internal circuit 10 with the above-described structure will be described with reference to FIG. 2. This semiconductor integrated circuit operates synchronously with an input clock signal CLK. FIG. 2 shows a timing chart assuming that the built-in memory 13 shown in FIG. 1 is an SRAM.

First, the ID write operation will be described. When the power to a device is turned on, a power-on reset signal is input to the IC through the terminal 14 shown in FIG. 1, whereby the IC is reset. Specifically, a reset signal XRST shown in FIG. 2 is active (active at low level in this embodiment), whereby the ID write circuit 12 is also reset.

When the power-on reset is released, the reset signal XRST shown in FIG. 2 become high level. In response to this, the ID write circuit 12 sets an address signal RAMADDR of the built-in memory 13 to an ID write address "Address", and sets a read/write signal RAMRW of the built-in memory 13 to "write" (low level). The ID write circuit 12 then sets a chip select signal RAMCS of the built-in memory 13 to turn on (become high level), whereby the ID input as an input data signal RAMIN is written into a designated address of the built-in memory 13.

Next, ID read and recognition operations will be described. First, the CPU 200 reads the ID from the designated address of the built-in memory 13 through the terminal 15 and the CPU bus. The firmware 201 converts the ID read by the CPU 200 into a variable thereby recognizing the ID.

In the present embodiment, the ID is written into the built-in memory 13 immediately after the power-on reset of the IC is released. The CPU 200 may read the ID from the built-in memory 13 when the CPU 200 accesses the IC for the first time after the power-on reset of the IC, for example.

For example, this applies to the case where the firmware 201 controls the IC according to the type of a compatible chip by recognizing the type of the compatible chip. Specifically, when ICs manufactured by a company A and a company B are available as compatible chips used as the IC having the internal circuit 10 shown in FIG. 1, for example, the firmware 201 must identify that the IC connected to the CPU 200 is manufactured by either the company A or the company B. This is because these compatible chips are not completely the same and there are differences (incompatible parts) between these compatible chips. The firmware 201 recognizes the differences between these compatible chips according to the ID read from the IC connected to the CPU 200 thereby appropriately controlling the IC.

In this manner, the firmware 201 can identify that the IC connected to the CPU 200 is a certain one among compatible chips each time the CPU 200 accesses the IC for the first time after the IC is reset. General data is not overwritten into the address in which the ID is stored before the IC to be accessed by the CPU 200 starts normal operation. Therefore, the ID which is written immediately after reset of the IC is released can be properly recognized. It is almost unnecessary to recognize the ID again during normal operations once the firmware 201 recognizes the ID of the IC. Therefore, the firmware 201 may overwrite general data in the address in which the ID is stored, thereby omitting the need for confirming whether or not the ID is stored in that address.

Second Embodiment

Figure 3:
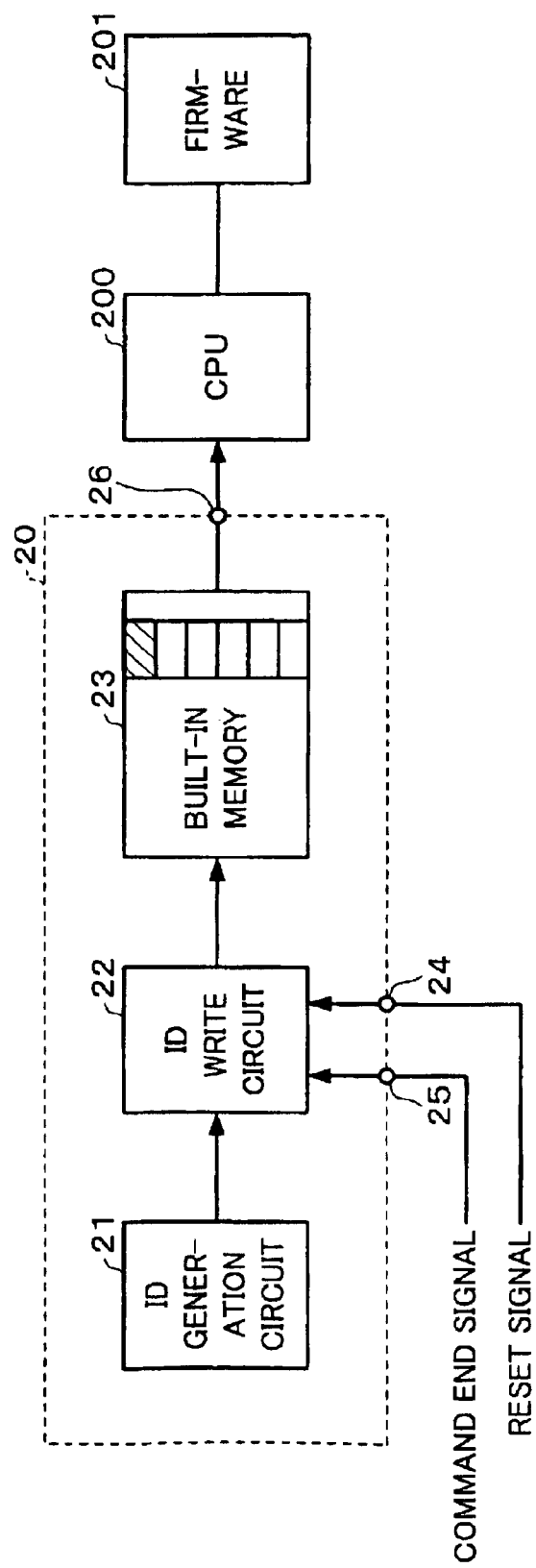
FIG. 3 shows a connection between a semiconductor integrated circuit according to a second embodiment of the present invention and an external circuit.

FIG. 3 shows a connection between a semiconductor integrated circuit according to a second embodiment of the present invention and an external circuit. The present embodiment is also applied to a device in which a semiconductor integrated circuit (IC) having a built-in memory is connected to an external circuit including a CPU in the same manner as in the first embodiment.

In FIG. 3, an internal circuit 20 of an IC has at least an ID generation circuit 21 which generates an ID, an ID write circuit 22 for writing the ID, and a built-in memory 23 used as a cache memory or the like. The ID write circuit 22 is formed by twenty to thirty gates in the same manner as in the first embodiment.

The difference between the internal circuit 20 shown in FIG. 3 and the internal circuit 10 shown in FIG. 1 is that the ID write circuit 22 writes the ID in response to a command end signal input through a terminal 25 in addition to a reset signal input through a terminal 24.

Figure 4:
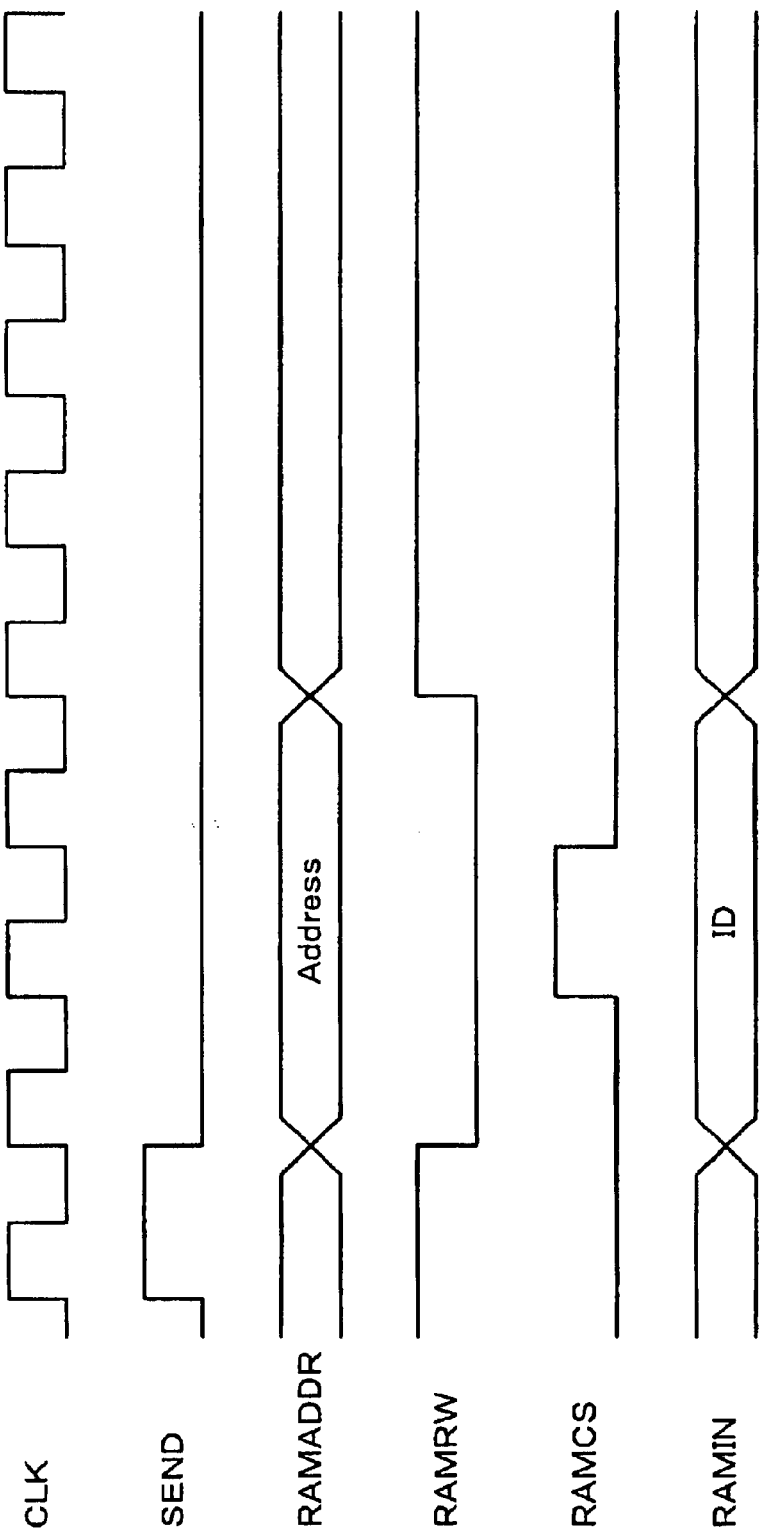
FIG. 4 is a timing chart showing signals used in a second embodiment of the present invention.

The operation of the internal circuit 20 shown in FIG. 3 will be described with reference to FIG. 4. The ID write operation of the internal circuit 20 when the reset signal is released after the power-on reset is the same as the that in the first embodiment shown in FIG. 2.

Therefore, the following description focuses on the write operation at the end of the command. When the command operation of the IC ends, a command end signal SEND becomes active (active at high level in this embodiment) for a predetermined period of time. In response to this, the ID write circuit 22 sets the address signal RAMADDR of the built-in memory 23 to the ID write address "Address", and sets the read/write signal RAMRW of the built-in memory 23 to "write" (low level). The ID write circuit 22 then turns on (set to high level) the chip select signal RAMCS of the built-in memory 23, whereby the ID input as the input data signal RAMIN is written into the designated address of the built-in memory 23.

The ID read and recognition operations are the same as those described in the first embodiment. Specifically, the CPU 200 reads the ID from the designated address of the built-in memory 23 through the terminal 26 and the CPU bus. The firmware 201 converts the ID read by the CPU 200 into a variable thereby recognizing the ID.

According to the present embodiment, the ID is stored not only when the IC is reset but also when the command ends. Such a command operation of IC is a repeating normal operation, and the ID is surely read once between two normal operations. Therefore, the problem in which the ID cannot be referred to because an address in which the ID is stored is overwritten by general data, can be further decreased without providing an ID write-only area outside the work area (area for storing general data) of the built-in memory 23.

Third Embodiment

Figure 5:
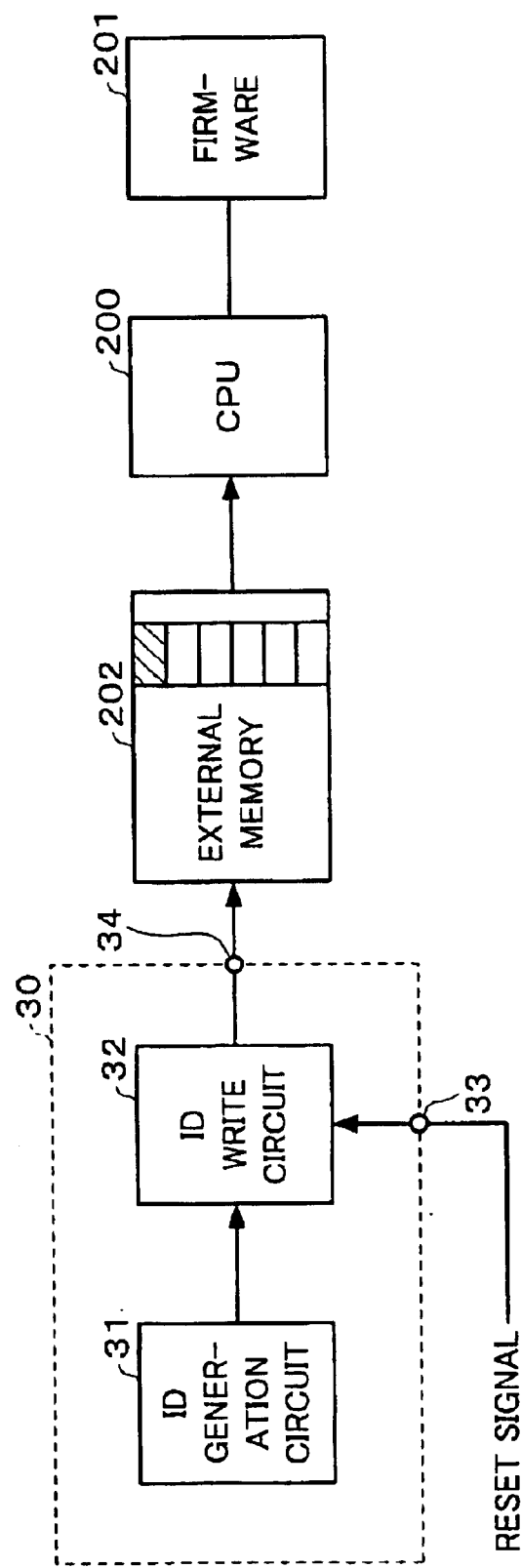
FIG. 5 shows a connection between a semiconductor integrated circuit according to a third embodiment of the present invention and an external circuit.

FIG. 5 shows a connection between a semiconductor integrated circuit according to a third embodiment of the present invention and an external circuit. The present embodiment is applied to a device in which a semiconductor integrated circuit (IC) having no built-in memory is connected to an external circuit including a memory and a CPU.

In FIG. 5, an internal circuit 30 of an IC has at least an ID generation circuit 31 which generates an ID and an ID write circuit 32 for writing the ID in response to a reset signal input through a terminal 33. In the present embodiment, since the internal circuit 30 of the IC has no built-in memory, an external memory 202 is used to store the ID. The ID generation circuit 31 generates the ID showing a production history (such as product version), a manufacturer's number, and the like of the IC chip. The ID write circuit 32 stores the ID in an address previously designated by the firmware 201 among addresses of the external memory 202 through a connection terminal 34. The external memory 202 is connected to the external CPU 200. The ID is read by the external CPU 200. The ID write circuit 32 can be formed by twenty to thirty gates.

Figure 6:
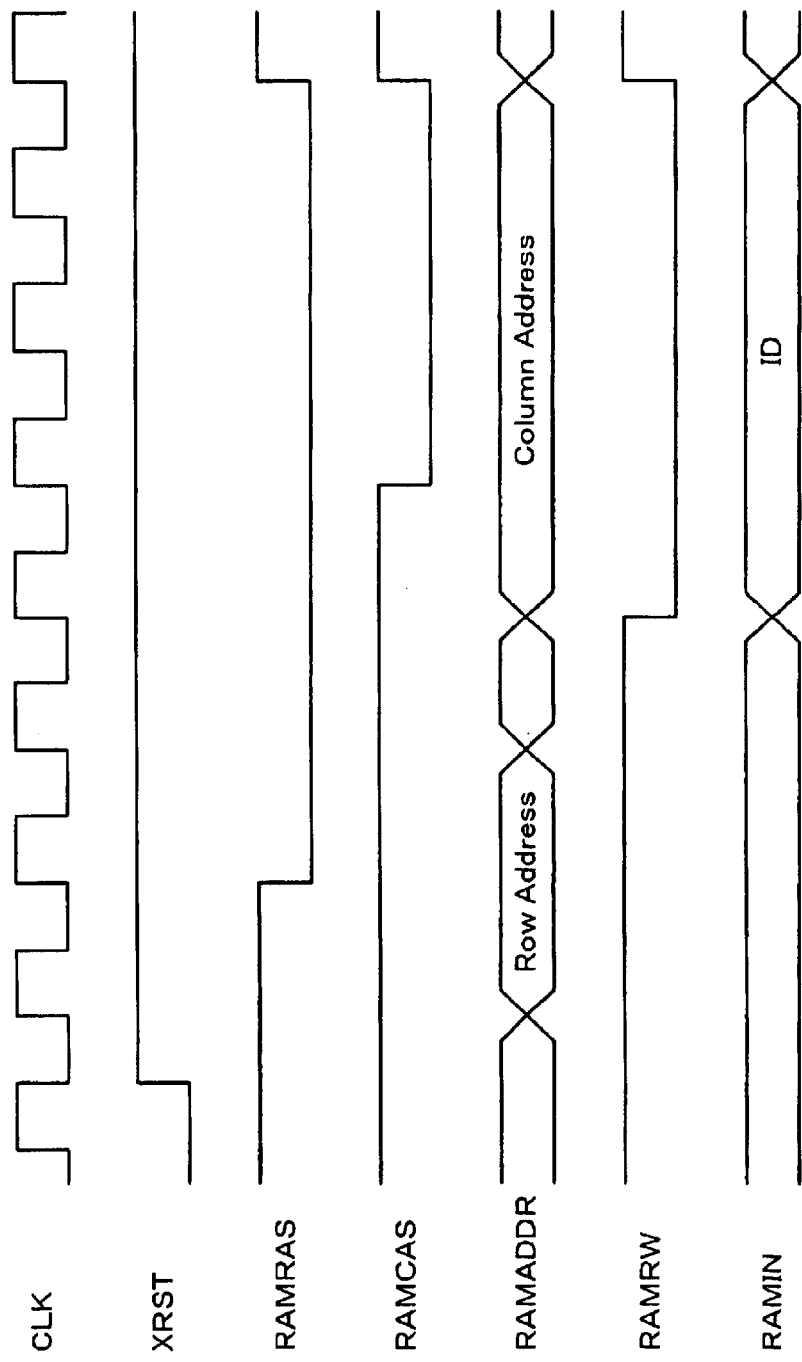
FIG. 6 is a timing chart showing signals used in a third embodiment of the present invention.

The operation of the semiconductor integrated circuit having the above-described structure will be described with reference to FIG. 6. FIG. 6 shows a timing chart assuming that the external memory 202 shown in FIG. 5 is a DRAM.

First, an ID write operation will be described. When the power to a device is turned on, the IC is power-on reset and the reset signal XRST is activated (active at low level in this embodiment), whereby the ID write circuit 32 is also reset. The power-on reset is then released and the reset signal XRST goes high. In response to this, the ID write circuit 32 sets the address signal RAMADDR to an ID write row address "Row Address", and activates a row address setting signal RAMRAS of the external memory 202 (active at low level in this embodiment) thereby designating the row address for storing the ID. The ID write circuit 32 then sets the address signal RAMADDR to an ID write column address "Column Address", sets the read/write signal RAMRW of the external memory 202 to "write" (low level), and activates a column address setting signal RAMRAS of the external memory 202 (active at low level in this embodiment), thereby designating the row address for storing the ID. This allows the ID which is input as the input data signal RAMIN to be written into the designated address of the external memory 202.

Next, the ID read and recognition operations will be described. The CPU 200 reads the ID stored in the designated address of the external memory 202 through the CPU bus. The firmware 201 converts the ID read by the CPU into a variable and recognizes the ID.

As described above, the same operations as those in the first embodiment can be performed in the third embodiment using the external memory 202 without providing a memory in the internal circuit 30 of the IC.

Fourth Embodiment

Figure 7:
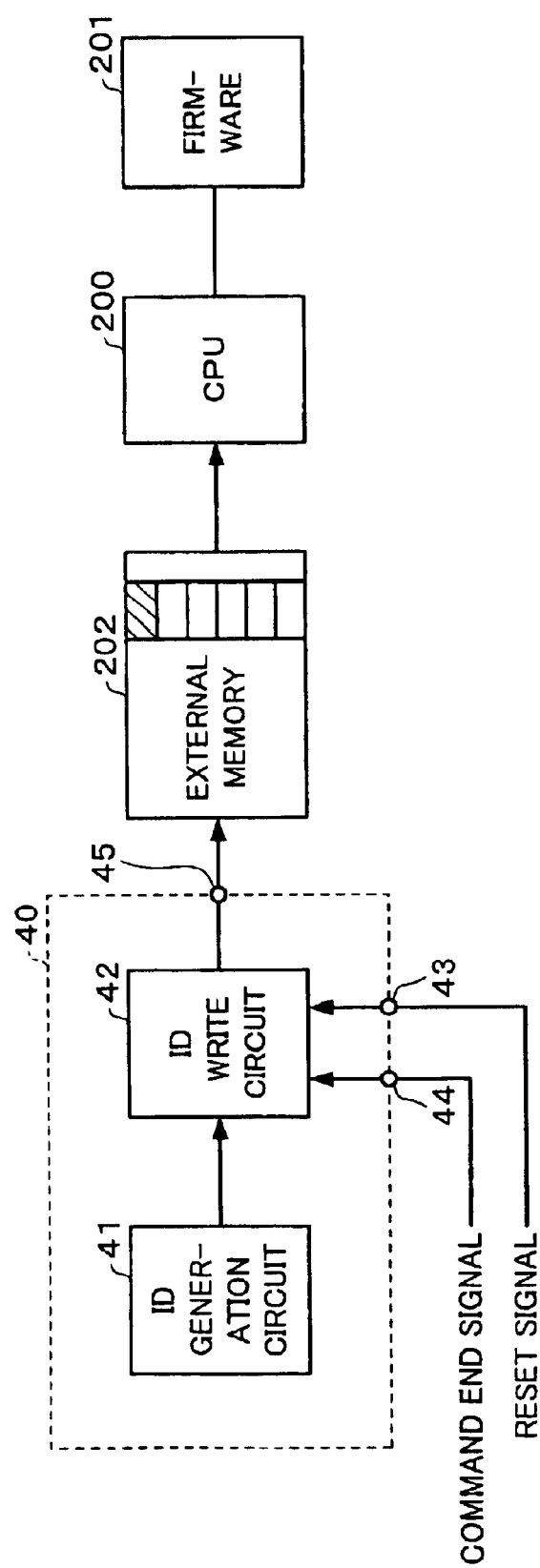
FIG. 7 shows a connection between a semiconductor integrated circuit according to a fourth embodiment of the present invention and an external circuit.

FIG. 7 shows a connection between a semiconductor integrated circuit according to a fourth embodiment of the present invention and an external circuit. The present embodiment is applied to a device in which a semiconductor integrated circuit (IC) having no built-in memory is connected to an external circuit including a memory and a CPU in the same manner as in the third embodiment.

An internal circuit 40 of an IC shown in FIG. 7 has at least an ID generation circuit 41 which generates an ID and an ID write circuit 42 for writing the ID into the external memory 202 through a terminal 45 in the same manner as in the third embodiment. In the fourth embodiment, the ID is written into the external memory 202 in response to a reset signal input through a terminal 43 and a command end signal input through a terminal 44 in the same manner as in the second embodiment. The ID write circuit 42 can be formed by twenty to thirty gates in the same manner as in the above embodiments.

According to the fourth embodiment, the ID can be written into the external memory 202 in the same manner as in the third embodiment in response to the reset signal and the command end signal as described in the second embodiment.

Fifth Embodiment

In a fifth embodiment of the present invention, a predetermined address of the built-in memory 13 or the external memory 202 used in the first and third embodiments is used as an ID write-only area. The ID write circuit 12 or 32 writes the ID into the ID write-only area when the IC is reset.

In the case where the area in which the ID is written is allocated within the work area in which general data is stored, if the timing at which the CPU 200 reads the ID is delayed after the ID has been written into the memory 13 or 202, the ID may be overwritten by general data whereby the ID cannot be referred to.

According to the present embodiment, the ID can be referred to even when the device is not reset by providing the ID write-only area outside the work area as in this embodiment. Another advantage of providing the ID write-only area separately from the work area is that the firmware 201 can be designed without regarding the possibility of overwriting the ID.

Sixth Embodiment

Figure 8:
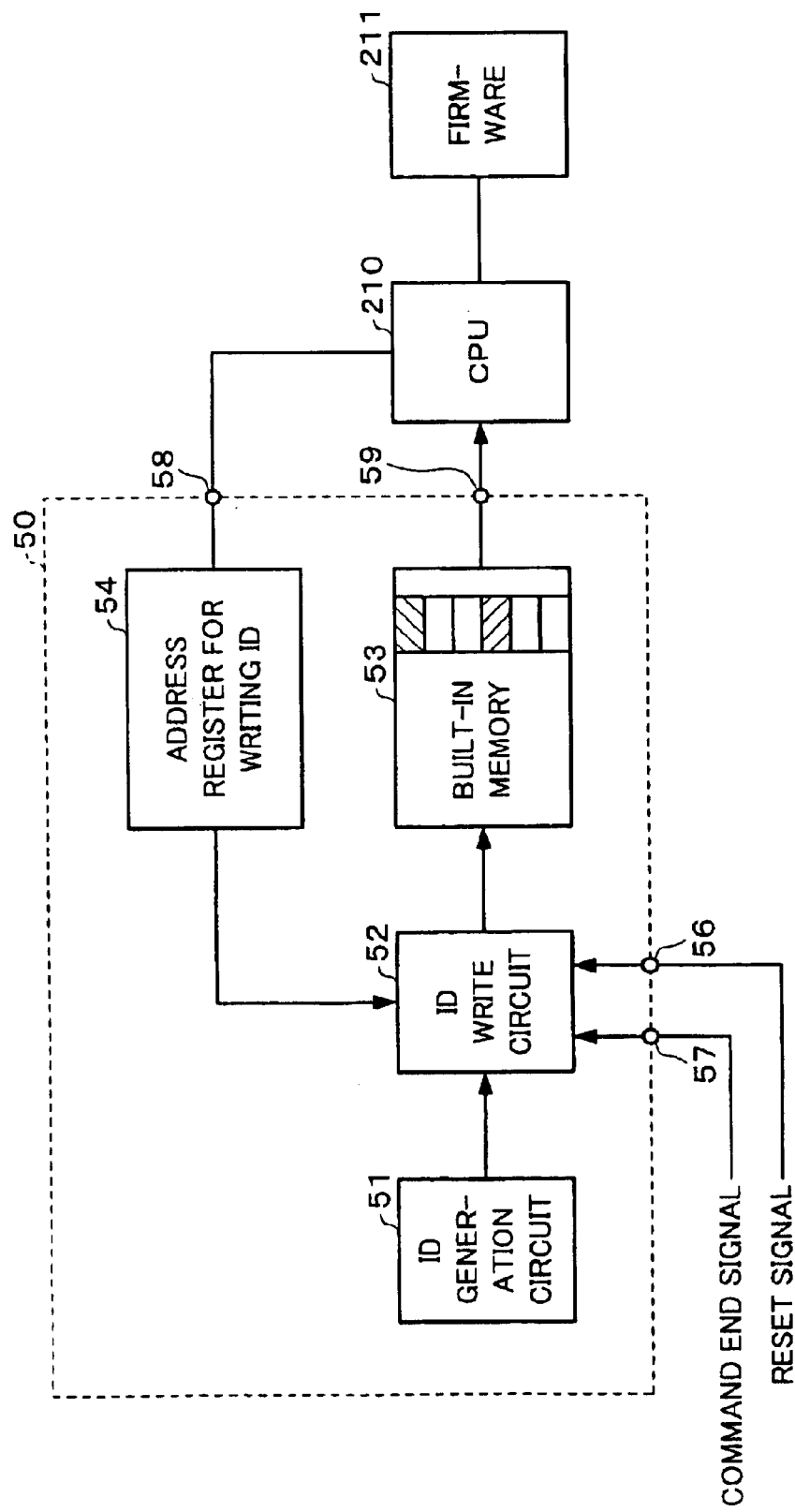
FIG. 8 shows a connection between a semiconductor integrated circuit according to a sixth embodiment of the present invention and an external circuit.

A sixth embodiment of the present invention will be described. FIG. 8 shows a connection between a semiconductor integrated circuit according to the sixth embodiment of the present invention and an external circuit. The present embodiment is applied to a device in which a semiconductor integrated circuit (IC) having a built-in memory is connected to an external circuit including a CPU.

In FIG. 8, an internal circuit 50 of an IC has at least an ID generation circuit 51 which generates an ID, an ID write circuit 52 for writing the ID in response to a reset signal input through an terminal 56 and a command end signal input through a terminal 57, and a built-in memory 53 used as a cache memory or the like. The ID of the IC chip is generated by the ID generation circuit 51 and stored in a designated address of the built-in memory 53 by the ID write circuit 52. The address is designated on the basis of address data stored in an address register 54 for writing the ID which is provided in the internal circuit 50 of the IC. The address register 54 for writing the ID is connected to an external CPU 210 through a connection terminal 58. The external CPU 210 changes the address data. The built-in memory 53 is connected to the external CPU 210 through a connection terminal 59. The ID is read by the external CPU 210, and firmware 211 which is one type of software that recognizes the ID. The firmware 211 appropriately controls the IC by specifying the production history, manufacturer's number, and the like of the IC chip.

Details of the ID write operation will be described. In the present embodiment, the ID is also written when the reset signal is released after the power-on reset. However, the following description focuses on the write operation at the end of the command. The CPU 210 sets the ID write address to the address register 54 for writing the ID before the IC performs command operations. As the D write address, an area in which general data is not stored is selected. When the command operation of the IC ends, the command end signal is active for a predetermined period of time. In response to this, the ID write circuit 52 sets the address signal of the built-in memory 53 to the ID write address, and sets the read/write signal of the built-in memory 53 to "write". The ID write circuit 52 then turns on a chip select signal of the built-in memory 53, whereby the ID is written into the designated address of the built-in memory 53.

Next, the ID read and recognition operations will be described. First, the CPU 210 reads the ID from the designated address of the built-in memory 53 through the terminal 59 and the CPU bus. The firmware 211 converts the ID read by the CPU 210 into a variable and recognizes the ID.

According to the present embodiment, since the address of the ID stored built-in memory 53 can be managed by the CPU 210, general data can be prevented from being overwritten onto the address where the ID is written.

Seventh Embodiment

Figure 9:
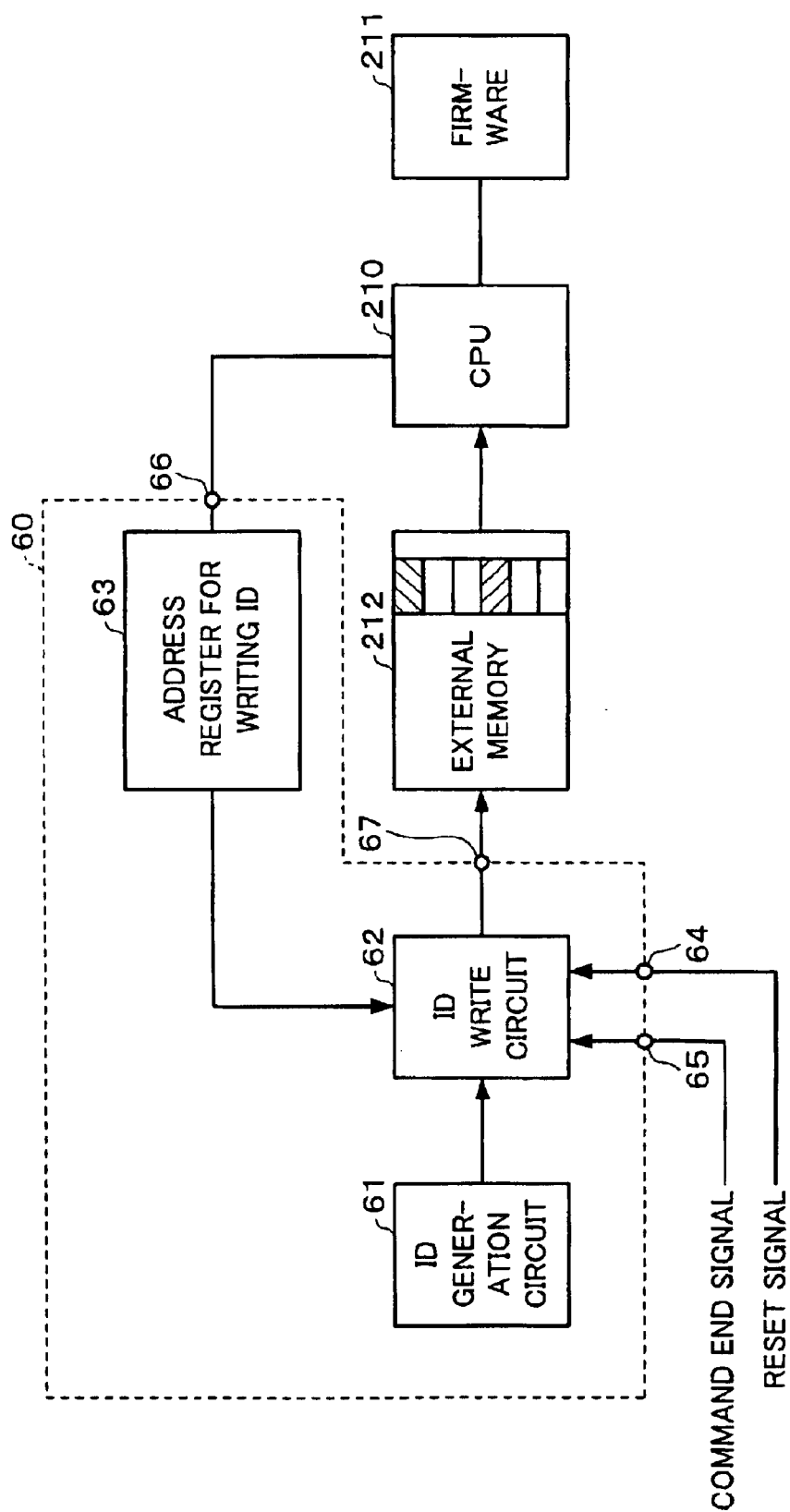
FIG. 9 shows a connection between a semiconductor integrated circuit according to a seventh embodiment of the present invention and an external circuit.

A seventh embodiment of the present invention will be described. FIG. 9 shows a connection between a semiconductor integrated circuit according to the seventh embodiment of the present invention and an external circuit. The present embodiment is applied to a device in which a semiconductor integrated circuit (IC) having no built-in memory is connected to an external circuit including a memory and a CPU.

In FIG. 9, an internal circuit 60 of an IC has at least an ID generation circuit 61 which generates an ID and an ID write circuit 62 for writing the ID in response to a reset signal input through a terminal 64 and a command end signal input through a terminal 65. In the present embodiment, since the IC internal circuit 60 has no built-in memory, an external memory 212 is used to store the ID. The ID of the IC chip is generated by the ID generation circuit 61 and stored in a designated address of the external memory 212 through a connection terminal 67 by the ID write circuit 62. The address is designated on the basis of address data stored in an address register 63 for writing the ID. The address register 63 for writing the ID is connected to the external CPU 210 through a connection terminal 66. The external CPU 210 changes the address data. The external memory 212 is connected to the external CPU 210. The ID is read by the external CPU 210.

According to the seventh embodiment, the same operations as those in the sixth embodiment can be performed for the external memory 212 without providing a memory in the internal circuit 60.

Eighth Embodiment

Figure 10:
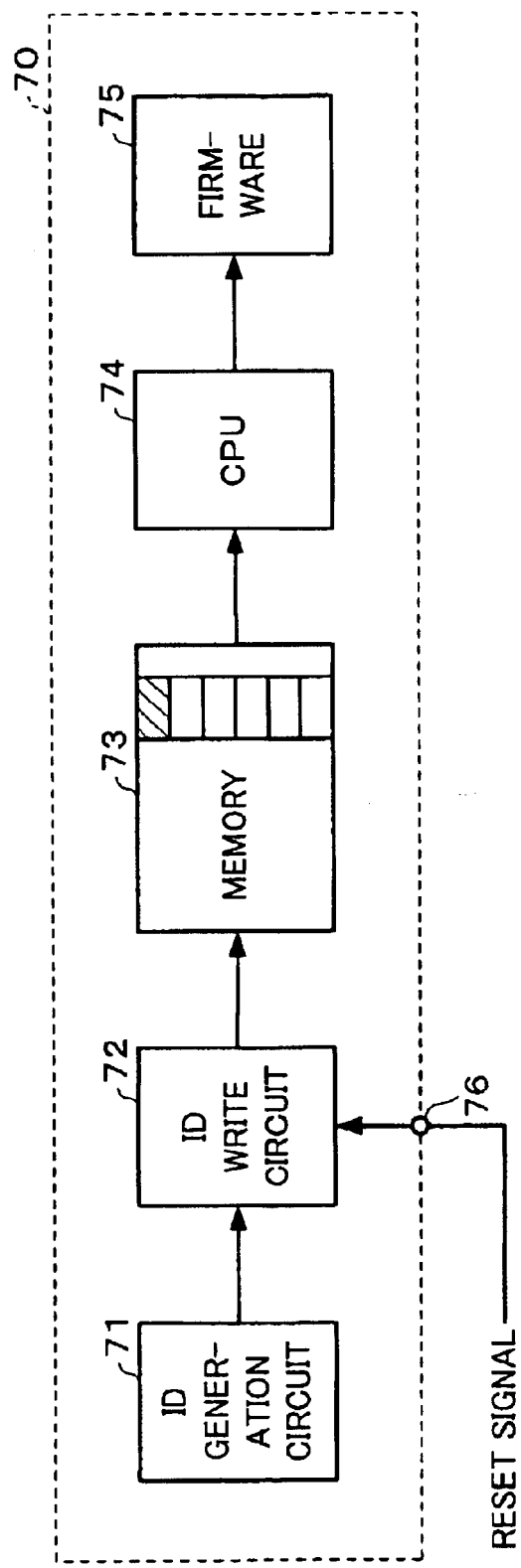
FIG. 10 shows an example of a semiconductor integrated circuit according to an eighth embodiment of the present invention.
Figure 11:
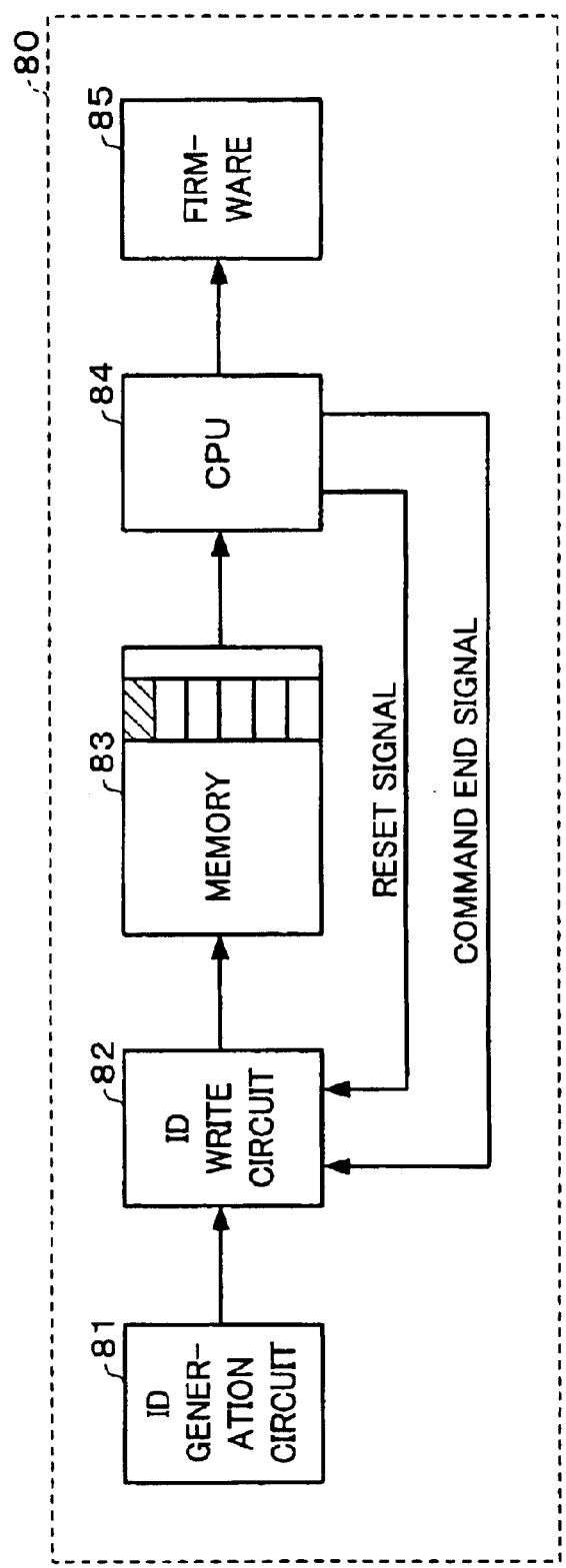
FIG. 11 shows another example of a semiconductor integrated circuit according to an eighth embodiment of the present invention.
Figure 12:
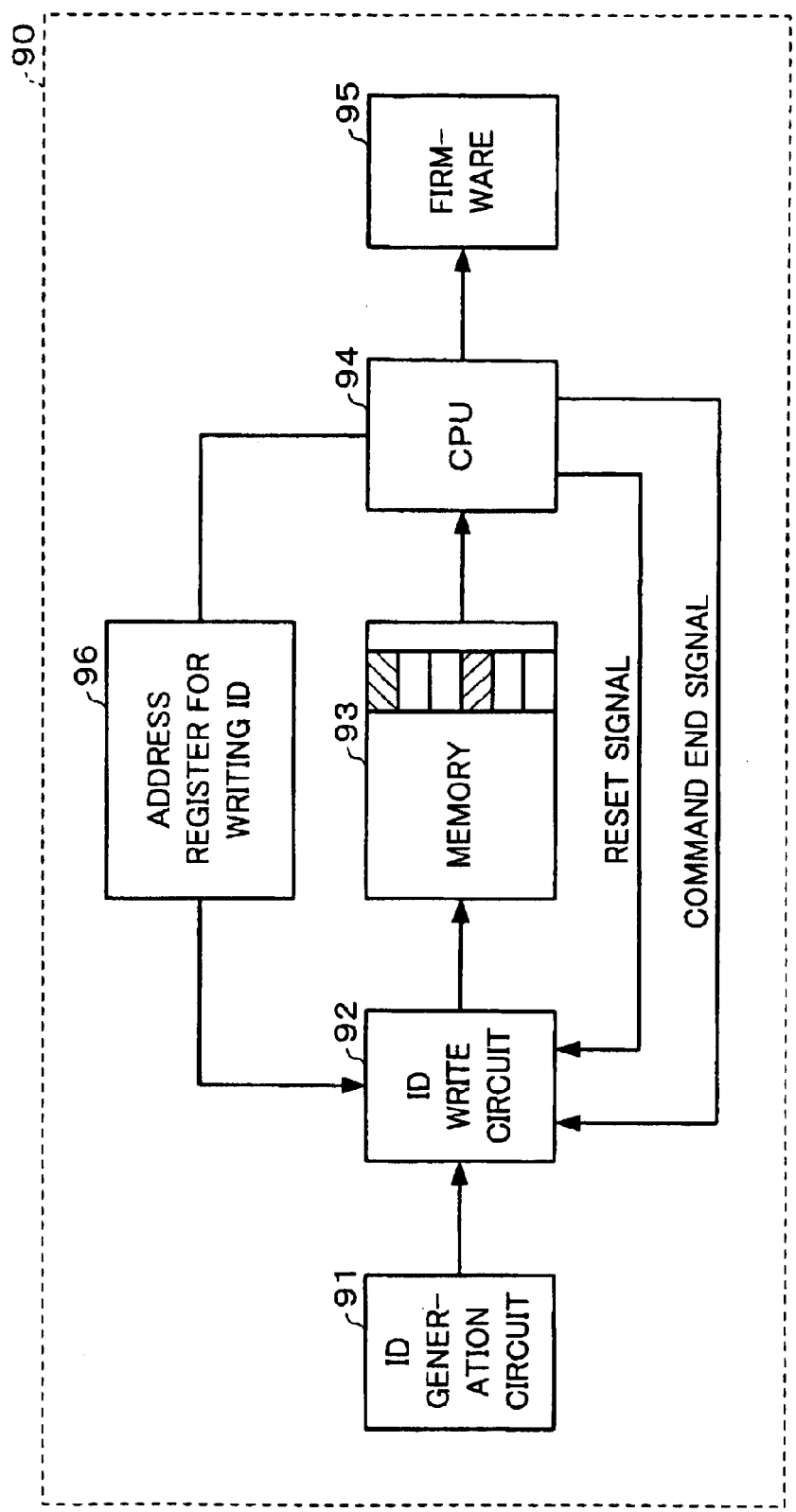
FIG. 12 shows still another example of a semiconductor integrated circuit according to an eighth embodiment of the present invention.

FIGS. 10 to 12 show semiconductor integrated circuits according to an eighth embodiment of the present invention. The semiconductor integrated circuits have a CPU in a chip similar to a system LSI and the like.

For example, an internal circuit 70 of an LSI shown in FIG. 10 has an ID generation circuit 71, an ID write circuit 72, a built-in memory 73, a CPU 74, and firmware 75. The ID write circuit 72 writes the ID according to a reset signal input through an internal terminal or external terminal 76. The reset signal is generally output from the CPU 74. In addition, the reset signal may be input from outside the LSI.

An internal circuit 80 of an LSI shown in FIG. 11 has an ID generation circuit 81, an ID write circuit 82, a built-in memory 83, a CPU 84, and firmware 85. The ID write circuit 82 writes the ID according to a reset signal and a command end signal output from the CPU 84, for example.

An internal circuit 90 of an LSI shown in FIG. 12 has an ID generation circuit 91, an ID write circuit 92, a built-in memory 93, a CPU 94, firmware 95, and an address register 96 for writing the ID. An address of the built-in memory 93 in which the ID is stored is determined according to address data in the address register 96 for writing the ID which can be changed by the CPU 94.

According to the semiconductor integrated circuits shown in FIGS. 10 to 12, in the case where there is a plurality of system LSI models each having partially different functions, for example, each LSI can be appropriately operated according to the functions by reading the ID corresponding to the function.

The present invention is not limited to the above embodiments. Various modifications are possible within the spirit and scope of the present invention.

For example, when the ID of the semiconductor integrated circuit includes information that recognizes the manufacturer of a compatible chip, the ID can be used as follows. Specifically, when testing a part lot or finished product lot equipped with one of several types of compatible chips before shipment, manufacturers of the compatible chips are specified by recognizing the ID. Codes showing the classification of the compatible chips are included in the production number attached to the parts or finished products.

This allows a classification such as the manufacturer of the compatible chips used in the parts or the finished products to be easily available from the production number when defects occur in the parts or finished products, thereby requiring repair. Therefore, the causes of the defects can be easily analyzed or countermeasures for the defects can be easily taken.

In the above description, as an example of the timing when writing the ID when the semiconductor integrated circuit shifts from the sleep state to the normal operation state, the timing at which the reset is released after the power-on reset is given. Moreover, reset signals other than the reset signal at the time of powering-on may also be used. For example, a sleep release signal, chip-enable signal, and the like may be used.

Furthermore, when writing the id during the repeated normal operations of the semiconductor integrated circuit, methods other than that using the command end signal may be used.

What is claimed is:

1. A semiconductor integrated circuit connected to an external processor comprising:
   a memory which stores data;
   a terminal which connects the memory with the processor;
   an information generation circuit which generates production information about the semiconductor integrated circuit; and
   a write circuit which writes the information into the memory before the semiconductor integrated circuit starts normal operation and when a command from the processor ends.

2. The semiconductor integrated circuit according to claim 1, wherein the write circuit writes the information into the memory after the semiconductor integrated circuit is reset.

3. The semiconductor integrated circuit according to claim 1, wherein the memory is a cache memory being accessed by the processor.

4. The semiconductor integrated circuit according to claim 1,
   wherein the production information comprises at least one of a production history and a manufacturer's name of the semiconductor integrated circuit.

5. A semiconductor integrated circuit connected to an external processor comprising:
   a memory which stores data;
   a terminal which connects the memory with the processor;
   an information generation circuit which generates production information about the semiconductor integrated circuit; and
   a write circuit which writes the information into the memory before the semiconductor integrated circuit starts normal operation and when a sleep state of the semiconductor integrated circuit is released.

6. A semiconductor integrated circuit connected to an external processor comprising:
   a memory which stores data;
   a terminal which connects the memory with the processor;
   an information generation circuit which generates production information about the semiconductor integrated circuit;
   a write circuit which writes the information into the memory before the semiconductor integrated circuit starts normal operation; and
   a register which receives address data of an area of the memory where the information is written, from the processor, and wherein the write circuit writes the address data into the memory.

7. A semiconductor integrated circuit connected to a combination of an external memory and a processor comprising:
   a terminal connected to the external memory;
   an information generation circuit which generates production information about the semiconductor integrated circuit; and
   a write circuit which writes the information into the external memory through the terminal before the semiconductor integrated circuit starts normal operation and when a sleep state of the semiconductor integrated circuit is released.

8. The semiconductor integrated circuit according to claim 7,
   wherein the write circuit writes the information into the external memory after the semiconductor integrated circuit is reset.

9. The semiconductor integrated circuit according to claim 7,
wherein the write circuit writes the information into the external memory when a command from the processor ends.

10. The semiconductor integrated circuit according to claim 7, further comprising:
a register which receives address data of the area where the information is written, from the processor, and wherein the write circuit writes the address data into the external memory.

11. The semiconductor integrated circuit according to claim 7,
wherein the information comprises at least one of a production history and a manufacturer's name of the semiconductor integrated circuit.

12. A semiconductor integrated circuit having a built-in processor comprising:
a memory which is connected to the processor and stores data;
an information generation circuit which generates production information about the semiconductor integrated circuit; and
a write circuit which writes the information into the memory before the semiconductor integrated circuit starts normal operation and when a sleep state of the semiconductor integrated circuit is released.

13. The semiconductor integrated circuit according to claim 12,
wherein the write circuit writes the information into the memory after the semiconductor integrated circuit is reset.

14. The semiconductor integrated circuit according to claim 12,
wherein the write circuit writes the information into the memory when a command from the processor ends.

15. The semiconductor integrated circuit according to claim 12,
wherein the memory is a cache memory being accessed by the processor.

16. The semiconductor integrated circuit according to claim 12, further comprising:
a register which receives address data of the area where the information is written, from the processor, and wherein the write circuit writes the address data into the memory.

17. The semiconductor integrated circuit according to claim 12,
wherein the information comprises at least one of a production history and a manufacturer's name of the semiconductor integrated circuit.

* * * * *